United States Patent
Edevold et al.

(12) 
(10) Patent No.: US 6,374,460 B1
(45) Date of Patent: Apr. 23, 2002

(54) MULTI-FUNCTION HANDLE AND MODULAR CHASSIS INCORPORATING SAME

(75) Inventors: Craig Edevold, Tomah; Cary Winch, Necedah, both of WI (US)

(73) Assignee: Powerware Corporation, Raleigh, NC (US)

( * ) Notice: Subject to any disclaimer, the term of this patent is extended or adjusted under 35 U.S.C. 154(b) by 0 days.

(21) Appl. No.: 09/538,056

(22) Filed: Mar. 29, 2000

(51) Int. Cl.[7] ................................................ A45F 5/10
(52) U.S. Cl. ...................... 16/422; 361/725; 361/727; 312/223.1; 294/169
(58) Field of Search .................... 16/422, 413, 412, 16/438; 312/244, 223.1, 333, 223.2, 322.1; 361/724, 725, 727, 685, 747; 294/169, 15; 360/137

(56) References Cited

U.S. PATENT DOCUMENTS

| | | | | |
|---|---|---|---|---|
| 3,923,191 A | * | 12/1975 | Johnson | 294/15 |
| 4,912,808 A | * | 4/1990 | Blakely | 16/422 |
| 5,010,426 A | * | 4/1991 | Krenz | 360/137 |
| 5,791,753 A | * | 8/1998 | Paquin | 312/223.1 |
| 5,808,867 A | * | 9/1998 | Wang | 361/725 |
| 6,134,115 A | * | 10/2000 | Sim et al. | 361/727 |
| 6,222,736 B1 | * | 4/2001 | Sim et al. | 361/727 |
| 6,231,145 B1 | * | 5/2001 | Liu | 361/727 |
| 6,272,005 B1 | * | 8/2001 | Jensen et al. | 361/725 |
| 6,288,902 B1 | * | 9/2001 | Kim et al. | 361/725 |

FOREIGN PATENT DOCUMENTS

| | | |
|---|---|---|
| DE | 32 00 889 | 1/1983 |
| DE | 299 19 473 | 2/2000 |

* cited by examiner

Primary Examiner—Lynne H. Browne
Assistant Examiner—Doug Hutton
(74) Attorney, Agent, or Firm—Leydig, voit & Mayer, Ltd.

(57) ABSTRACT

Provided is a multi-function, single-piece handle and modular electronic component incorporating same, and a method of inserting and removing the handle from the modular electronic component. The unitary structure of the handle includes insertion and extraction claws that aid in the insertion and extraction of the modular component from a rack mount upon rotation of the handle to an upward, and vertically extended position respectively. The handle also includes a stowage locking mechanism that maintains the handle in a stowed position on the front of the modular component. A rack locking mechanism is also provided integral with the handle to secure the modular component in its rack mount position. Affirmative user actuation is then required to allow the modular component to be removed therefrom. Outrigging mounting and support legs are also included to add rigidity and strength to the handle to allow it to be used to carry the modular component. By design, the handle may be inserted and removed from the modular component without the use of any tools, and is secured in place without the requirement of any additional hardware.

19 Claims, 11 Drawing Sheets

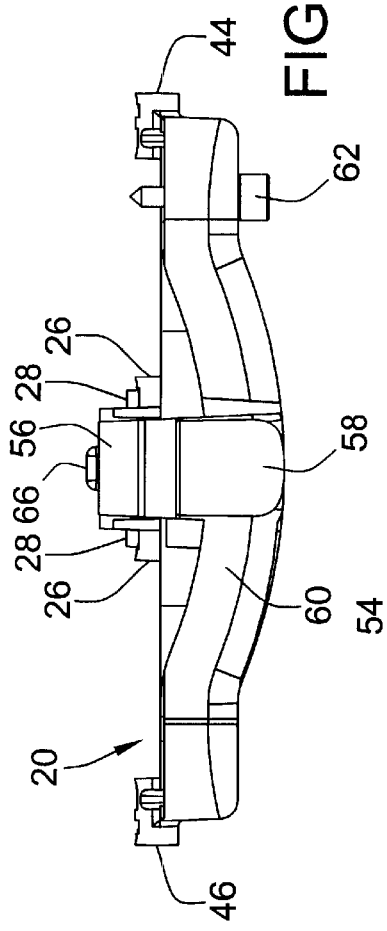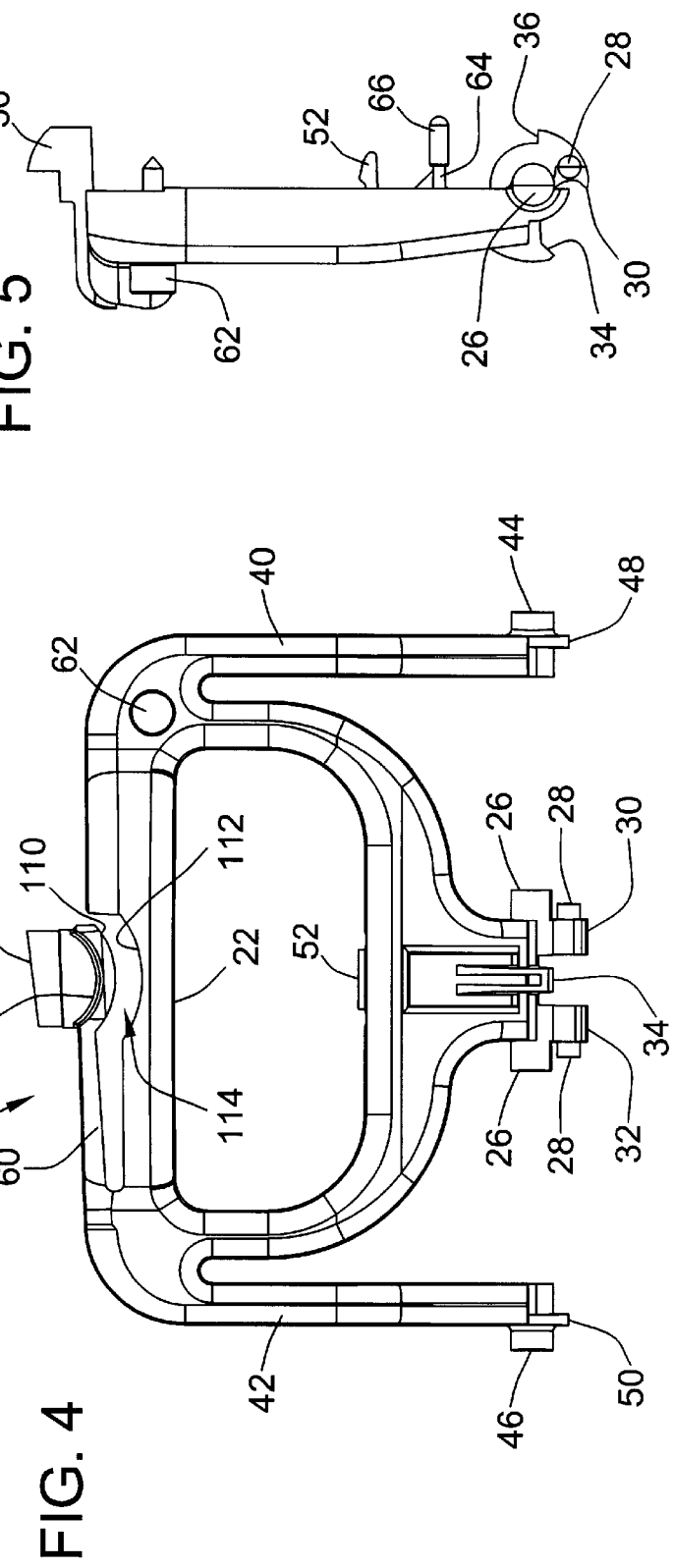

MULTI-FUNCTION HANDLE AND MODULAR CHASSIS INCORPORATING SAME

FIELD OF THE INVENTION

This invention relates to modular electronic equipment packaging, and more particularly to insertion, extraction, and carrying handles for use therewith.

BACKGROUND OF THE INVENTION

As more and more segments of the business environment enter the information age, more and more computers and computing power are required. As businesses move from the old to the new economy their reliance on the processing, transference, and storage of digital information is becoming a more and more critical aspect of their overall business strategy. While in the past, computer crashes were seen as a mere nuisance, the loss of computing power and business data may well devastate a business's ability to survive in today's new economy. As such, the need for reliable, uninterruptible electric power to maintain the operational status of the computing equipment and the integrity of the digital data continues to rise.

To meet these requirements, uninterruptible power supplies (UPS) have been developed. These UPSs utilize a bank of electric storage batteries and solid state conversion and charging equipment to provide continuous electric power to a business's computer systems in the event of a loss of power from the utility or a deviation from the normal regulated utility specifications. The number of batteries contained within an UPS is dependent upon the business's length of time and its needs to operate in the event of a utility power system failure. Further, the number of power inverters required to supply the total load demand of a business also controls the size and number of inverters necessary in the UPS. The number of battery chargers is also somewhat dependent on these factors and the business's requirement for the speed at which discharged batteries are required to come back online.

Since each of these parameters are dependent upon the particular makeup, structure, and operational requirements of different businesses, the provision of any single UPS configuration will likely only completely meet the needs of a small segment of the overall business environment. As such, modular uninterruptible power supplies have been developed that allow, to some extent, the reconfigurability of an UPS based upon the actual requirements of any particular business. For businesses that have only a small power output requirement but with a corresponding long duration need, their modular UPS may be configured with multiple battery banks and only a single inverter. Another business may have a larger power draw requirement necessitating the inclusion of multiple inverters.

Indeed, the particular requirements of any single business may change depending on the nature of their business. For example, while a business may have a short term high power requirement of its UPS, business operating procedures may dictate that non-essential computing equipment be taken offline as it appears that a power failure may last an extended period of time. In such a situation, additional power inverters required during the short term power losses may then be replaced with additional battery banks to provide a long term power supply to critical computing equipment during the power outage event.

While it is nearly impossible to anticipate all of the various needs and operating conditions of all of the business enterprises engaged in computing activities, it is possible to provide rapidly reconfigurable modular UPSs that allow the flexibility for a business to achieve its goals, even when these goals change during a particular event. Prior modular UPSs were typically constructed from a plurality of plug-in modular components contained in a rack-mount housing. Unfortunately, while the insertion of these modular components was fairly easily accomplished by pushing on their front face once started in their rack position, the extraction and transportation of these components was not so easily accomplished.

To aid in the extraction and transportation of these components, handles were installed on the front face surface thereof. This would allow a technician to pull the unit out of its rack mount position and carry the component to its offline storage location. Unfortunately, these handles were typically rigid mounted metallic handles that were bolted to the front of the components. These handles added to the cost of the components and to their assembly time. Further, since these handles needed to allow for a technician to grip them and carry the modular unit, they needed to be spaced from the front surface. As may well be imagined by one skilled in the art, this increased the overall outer dimension of the UPS. While fold-down handles could reduce the overall external profile, it is also a requirement that the handles be able to support the weight of these components. This requires that the size of these handles be increased and secured to the chassis of the modular components in such a manner so as to accommodate this requirement. Unfortunately, these requirements tend to increase the material and labor costs associated therewith to a point that is detrimental to the competitive position of such units.

Therefore, there exists a need in the art for a handle for a modular electronic component that overcomes these and other known problems existing in the art.

SUMMARY OF THE INVENTION

An embodiment of the invention provides a multi-function handle for modular electronics that requires no external hardware for attachment to and retaining on the modular electronic housing. The construction of the handle may advantageously utilize injection molding materials as its overall configuration provides adequate support and rigidity to allow it to be utilized for the insertion, extraction, and carrying of the modular electronic unit to which it is attached. The handle cooperates with the housing of the modular electronics in such a fashion so as to allow the handle to be extended for carrying, and folded to reduce the overall outer dimension required by the modular unit.

For modular units that require a force to mate or unmate the connectors on the rear of the unit, the multi-function handle of the invention includes a mechanism to provide mechanical advantage to reduce the force required by the installer to properly mate and unmate the connector. A separate mechanism is also included to preclude operation of the modular unit unless and until the unit is fully seated in its mount. Further, an embodiment of the handle of the invention provides a mechanism to retain the modular electronics in its rack mounted position until a user removes it. An additional securing mechanism may also be provided to inhibit the handle from inadvertently extending from its folded position until such is desired by a user.

In a preferred embodiment the multi-function handle provides a comfortable grip for carrying the modular electronics. The coupling of the handle to the electronics is preferably accommodated by a central mounting yoke integrally formed with the handle. This mounting yoke preferably includes an integrally formed pivot axle and a secondary follower axle that accommodate a concave pivot surface of the front panel of the modular electronics. This allows the handle to rotate from a stowed to a deployed position.

To provide for added stability and allow the handle to utilize injection molded materials for its construction, the handle preferably includes two outrigging mounting and support legs that are accommodated by and communicate with slots on the front surface panel of the modular electronics. Preferably, these slots include a concave and a convex surface that accommodates the insertion of the outrigging mounting and support legs by their inward flexure, and provides a support surface that allows rotation of the handle and that provides mechanical support therebetween. Once inserted, the legs preferably prevent the handle's rotation beyond a perpendicular position relative to the front surface of the modular electronics, thereby precluding the handles inadvertent removal.

The handle preferably also communicates with the front surface of the modular electronics to provide a stowage locking mechanism for the handle in its stowed position. Further, an aperture in the front of the modular electronics' housing also accommodates the insertion of a switch actuation mechanism that provides a signal indication to the modular electronics that the handle is in its stowed position, typically signifying that the module is fully seated.

In addition to coordinating with the modular electronics housing itself, the multi-function handle also provides functional relationships with the mounting rack itself. Specifically, a preferred embodiment of the multi-function handle includes insertion claws. These insertion claws cooperate with the mounting rack to provide a mechanical advantage as the handle is rotated from its extended to stowed position to reduce the amount of force required by the technician to fully install the modular electronics into the rack. This mechanism also prevents the inadvertent removal of the modular electronics as it seats behind a surface of the rack thereby inhibiting removal of the modular electronics unless and until the handle is moved from its stowed position to its extended position.

The handle also preferably includes an extraction 80 mechanism. This extraction mechanism 80 cooperates with the mounting rack as the handle is being moved from its stowed to its extended position, aiding in the extraction of the module thereby. The handle preferably further cooperates with the mounting rack by providing a locking mechanism to further secure the modular electronics in place once the handle is moved to its stowed position. To disengage this locking mechanism, a preferred embodiment requires a user to actuate the mechanism prior to allowing the handle to be moved from its stowed to its extended position.

Other object and advantages of the invention will become more apparent from the following detailed description when taken in conjunction with the accompanying drawings.

BRIEF DESCRIPTION OF THE DRAWINGS

The accompanying drawings incorporated in and forming a part of the specification illustrate several aspects of the present invention, and together with the description serve to explain the principles of the invention. In the drawings:

FIG. 3 is a frontal perspective illustration of the embodiment of the multi-function handle illustrated in FIG. 1;

FIG. 4 is a top view perspective illustration of an embodiment of the multi-function handle of the invention;

FIG. 5 is a side view perspective illustration of an embodiment of the multi-function handle of the invention;

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE PREFERRED EMBODIMENTS

Figure 1:
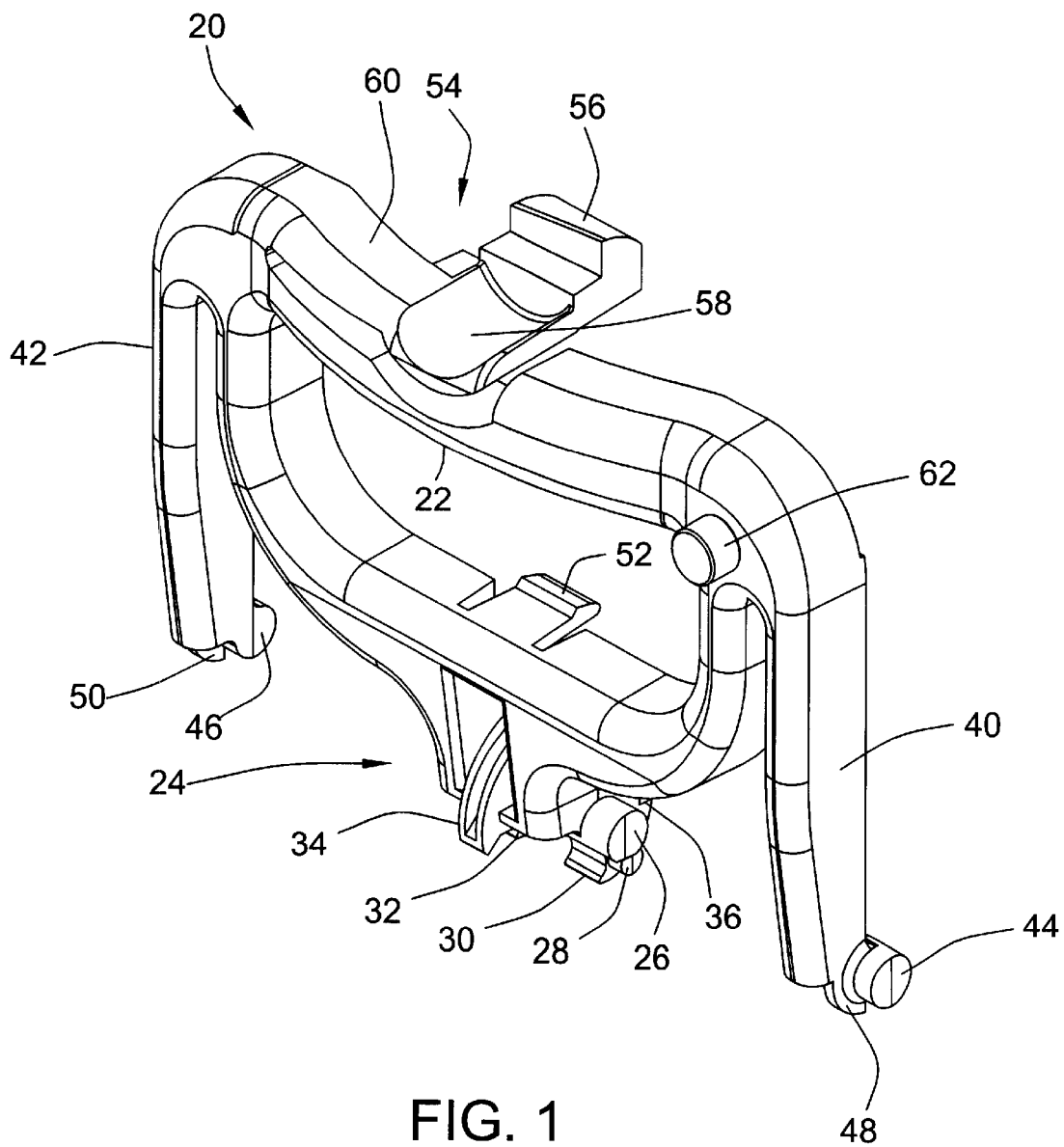
FIG. 1 is a front perspective illustration of a multi-function handle constructed in accordance with the teachings of the invention.

An embodiment of a handle constructed in accordance with the teachings of the invention is illustrated in a front perspective view in FIG. 1. This handle 20 includes a carrying surface 22 to allow a user to easily convey a modular electronic component from one location to another in a conventional manner. The handle 20 is preferably mounted to the modular component via a central mounting yoke 24. This central mounting yoke 24 includes a pivot axle 26 and a secondary follower axle 28 that secure the handle to the modular component to which it is attached, and allow the handle to rotate between at least two positions as will be discussed more fully below.

The central mounting yoke 24 also includes insertion claws 30, 32 that aid in the insertion of the modular component into an electronic storage rack. The extraction of the modular component is aided by an additional structure in the central mounting yoke 24, that being the extraction claw 34. The insertion claws 30, 32 also include an extended position support surface 36, 38 (See FIG. 8). These support surfaces prevent the handle 20 from rotating beyond its extended position, and also provide support for the electronic component while being extracted and carried by the handle 20.

In a preferred embodiment, the handle 20 also includes outrigging mounting and support legs 40, 42 that also mate with the front surface of the modular component to provide additional support and rigidity for the handle 20. Each of the outrigging mounting and support legs 40, 42 include supplemental support pivots 44, 46 respectively. These supplemental support pivots 44, 46 aid in maintaining the handle in proper alignment during the rotation thereof, and also provide an additional support surface for the extraction and carrying of the modular component by the handle. Once the handle is in its extended position (as will be described more fully below), removal inhibitor flanges 48, 50 prevent the outrigging mounting and support legs 40, 42 from being inadvertently removed from their mounting supports by prohibiting the inward flexure of the legs 40, 42.

A preferred embodiment of the handle 20 also includes a stowage locking mechanism or tab 52 which maintains the handle 20 in a stowed position with respect to the modular component. The handle 20 also preferably includes a rack locking mechanism 54 which, in conjunction with the insertion claws 30, 32, maintains the modular component in the locked position within the electronic component rack until removed by a user. This rack locking mechanism 54 includes a ramped insertion and locking surface 56, a user depression surface 58, and a locking deflection arm 60. The stowed position of the handle may be further aided by the inclusion of a thumbscrew 62 that may be provided to attach the handle to the front of the modular component in its stowed position.

Figure 2:
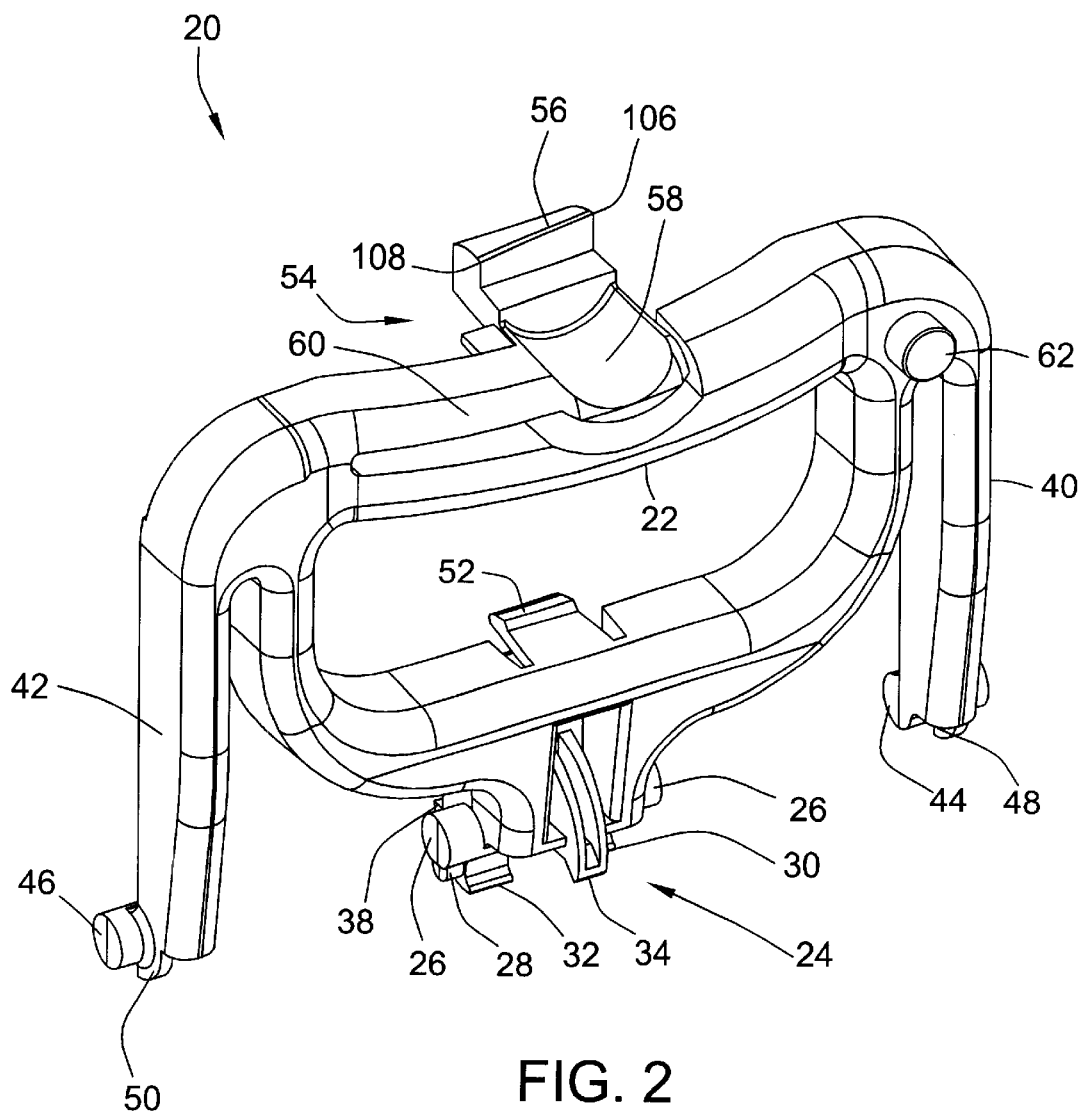
FIG. 2 is an alternate front perspective illustration of a multi-function handle in accordance with one embodiment of the invention.

FIG. 2 presents an alternate perspective view of the embodiment of the handle illustrated in FIG. 1. As may be seen from this alternate view, the ramped insertion surface 56 of the rack locking mechanism 54 is dimensioned such that in its quiescent position an outer edge 106 of the ramped insertion surface extends vertically further than the inner edge 108. This aids in the locking of the mechanism 54 into the electronics rack once the modular component has been inserted therein. Once a user has pushed down on the user depression surface 58 to flex the locking defection arm 60 in a downward direction, the ramped insertion surface slips below a mating locking lip of the electronics ramp to allow the handle to be rotated to the extended position and the modular component to be removed from the rack. In this depressed position, the surfaces 106 and 108 are in an approximate horizontal relationship with one another.

The amount of deflection of the rack locking mechanism may be more fully appreciated from an analysis of the direct frontal view of the handle as illustrated in FIG. 3. As may be seen more clearly from this FIG. 3, the locking deflection arm may be displaced downwardly by a user depressing the user depression surface 58 until the bottom surface 10 contacts the upper surface 112 of the rack locking mechanism accommodation groove 114.

FIG. 4 presents a top view illustration of the embodiment of the handle illustrated in FIG. 1. As may be seen from this illustration, the thumbscrew 62 penetrates the width of the handle 20 and extends there beyond to engage the front surface panel of the modular electronic component to which it is attached. A side view illustration of this embodiment of the handle of the invention is illustrated in FIG. 5. As may be seen from this illustration, a preferred embodiment of the handle 20 also includes a switch activation tab 64 which may preferably include an activation bumper 66 placed on the end thereof. As will be described more fully below, this switch activation tab 64 provides an indication to the modular electronic component that the switch is in its stowed position, typically indicating that the modular component is fully seated in its rack.

Figure 6:
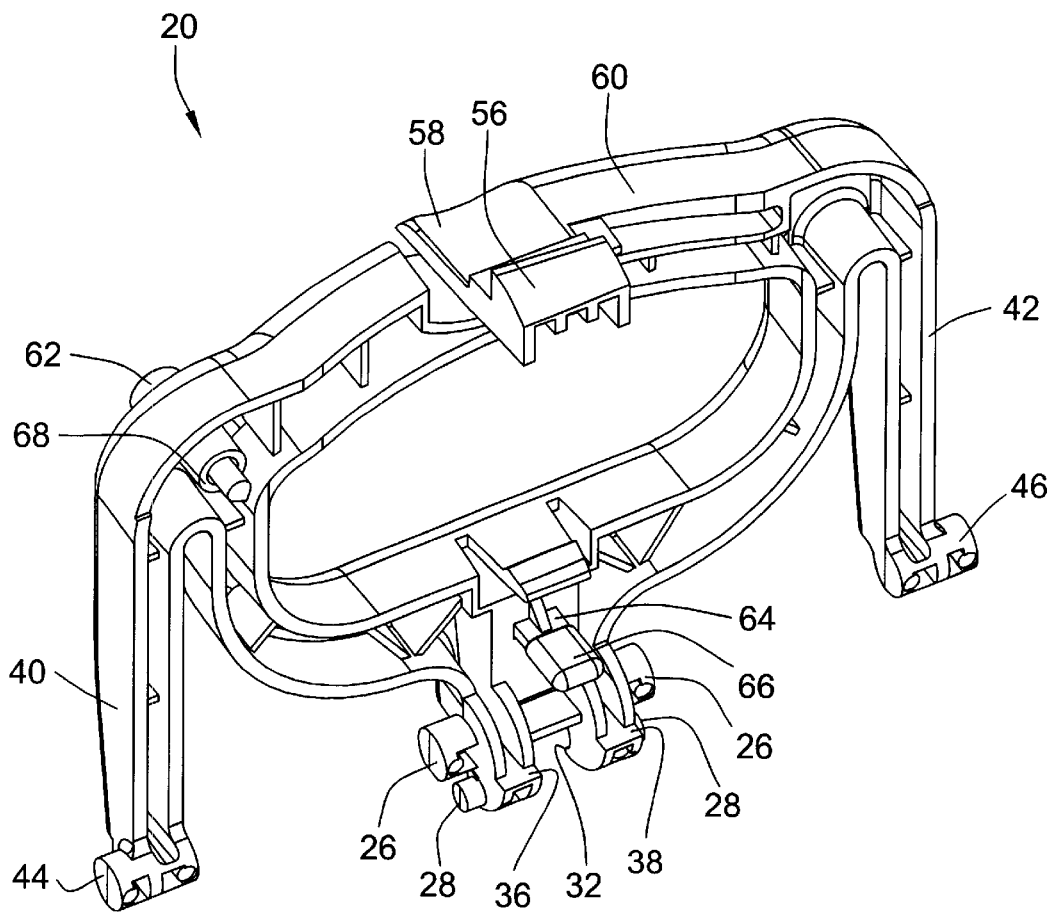
FIG. 6 is a rear perspective view illustration of an embodiment of the multi-function handle of the invention.

FIG. 6 presents a rear view illustration of the embodiment of the handle illustrated in FIG. 1. As may be seen from this rear view illustration, the thumbscrew 62 is accommodated in the handle 20 via a thumbscrew port 68 integrally molded therewith. Preferably, this port 68 has a smaller diameter on the front of the handle 20 to captivate the thumbscrew, but otherwise not unduly inhibit the user's operation thereof. As may also become apparent from an analysis of this FIG. 6, a preferred embodiment of the handle 20 is injection molded as a unitary, single piece unit. As such, the weight and cost of this handle 20 is substantially reduced over handles currently in use. However, one skilled in the art will recognize that other methods of manufacturing an embodiment of this handle may be utilized as appropriate or desired without deviating from the spirit and scope of the invention.

Figure 7:
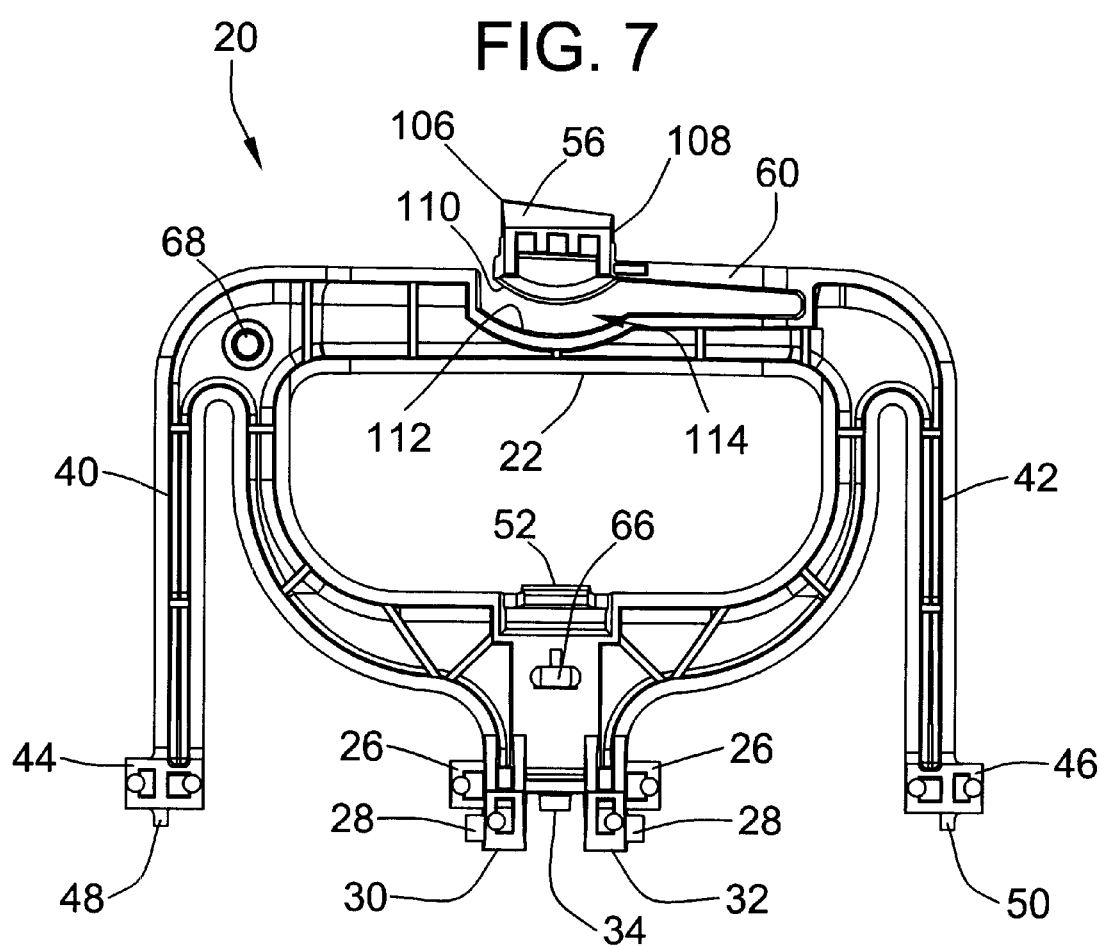
FIG. 7 is a rear perspective illustration of an embodiment of the multi-function handle of the invention.
Figure 8:
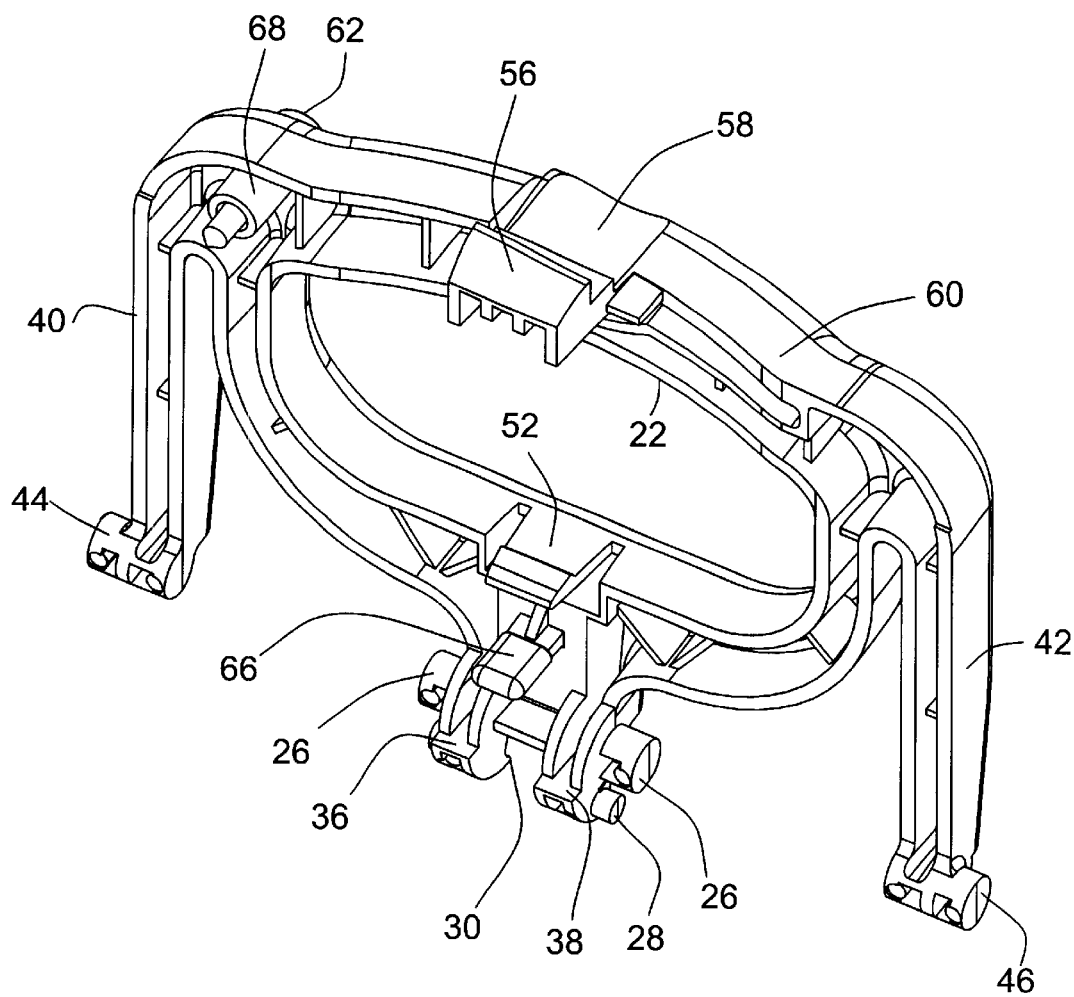
FIG. 8 is an alternate rear perspective illustration of an embodiment of the multi-function handle of the invention.
Figure 9:
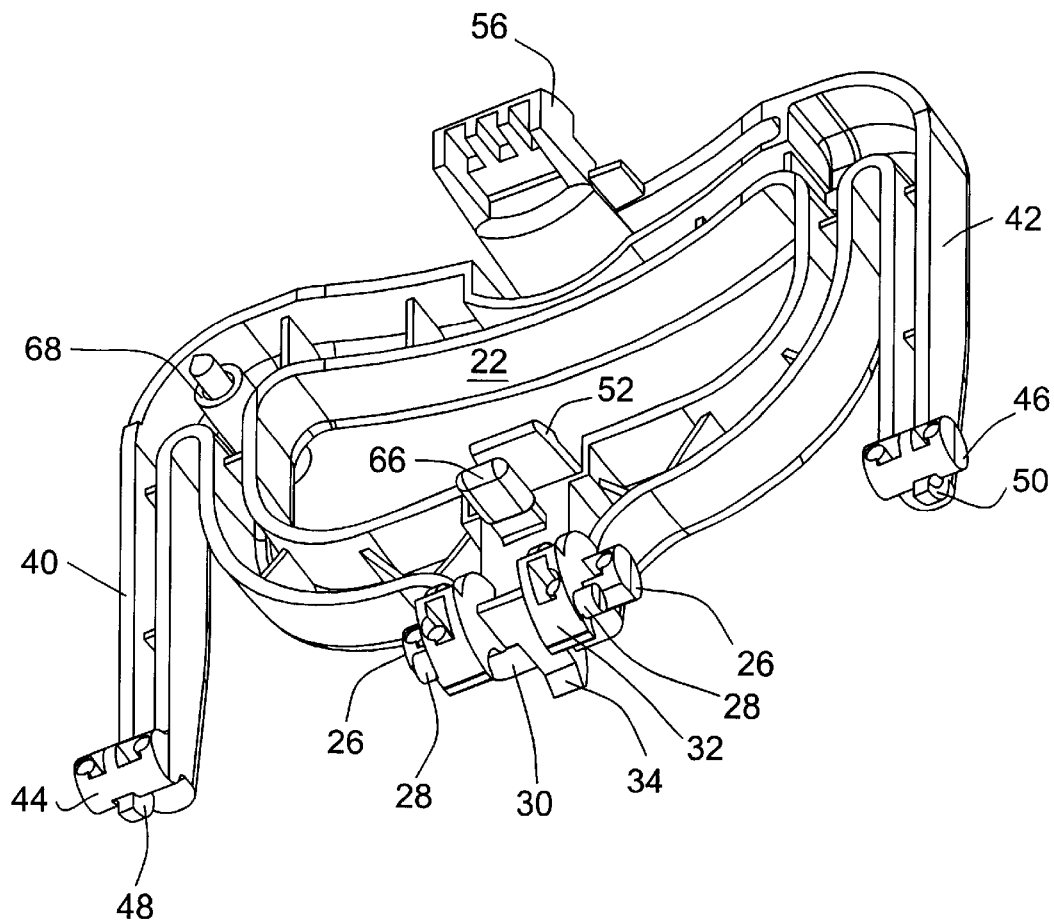
FIG. 9 is a further alternate rear perspective illustration of an embodiment of the multi-function handle of the invention.
Figure 10:
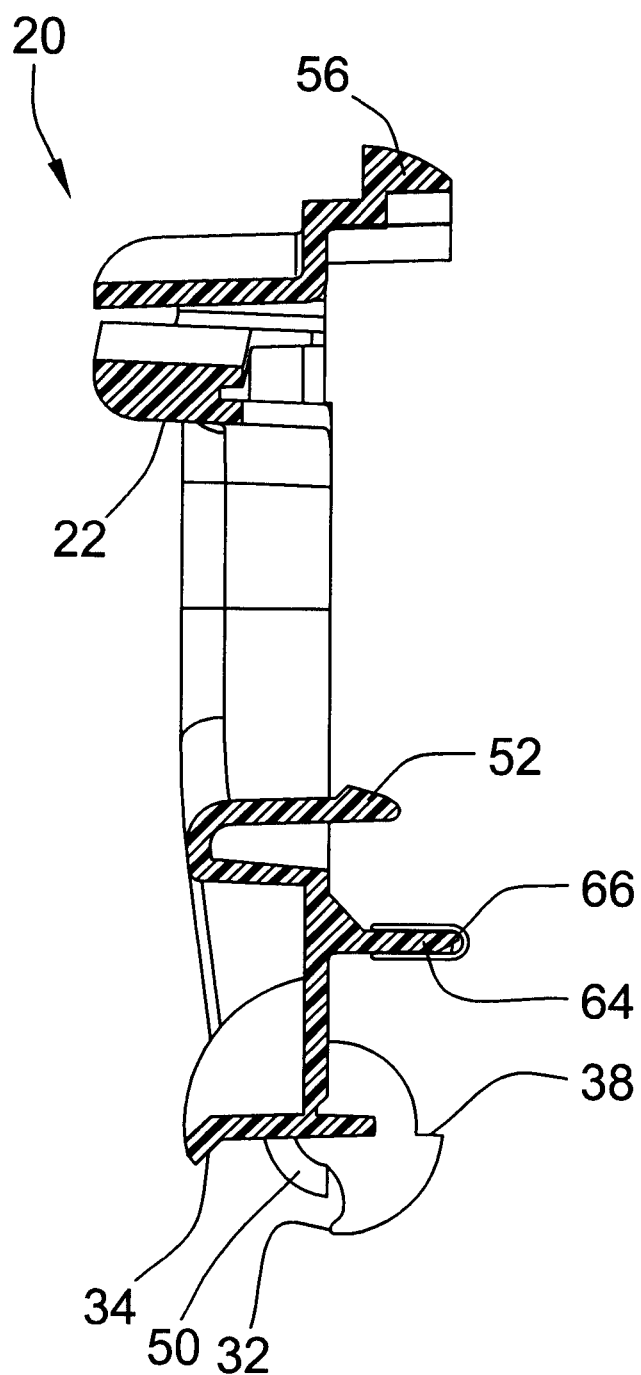
FIG. 10 is a partial cross-sectional side view illustration of an embodiment of the multi-function handle of the invention.

A further rear view illustration of the embodiment of the handle 20 of FIG. 8 is presented in FIG. 7. The relationship between the surface 106 and 108 of the ramped insertion surface 56 is clearly illustrated in this figure. The perspective rear view illustration presented in FIG. 8 clearly illustrates the extended position support surfaces 36, 38 which, as discussed briefly above, prevent the handle from over rotating beyond its extended position and aids in the support of the weight of the modular component while extracting and carrying same. Likewise, the relationship of the removal inhibitor flanges 48, 50 in relation to their supplemental support pivots 44, 46 are clearly illustrated in the rear upward perspective illustration of FIG. 9. This FIG. 9 also clearly illustrates the usage of support and strengthening ribs to increase the strength and rigidity of the handle while maintaining a lightweight design. A crosssectional view of the embodiment of the handle 20 illustrating the relationship between the switch activation tab 64 and the activation bumper 66 is illustrated in FIG. 10. As may be apparent to those skilled in the art, this cross-sectional view is taken along the centerline perpendicular to the plane of the handle.

Figure 11:
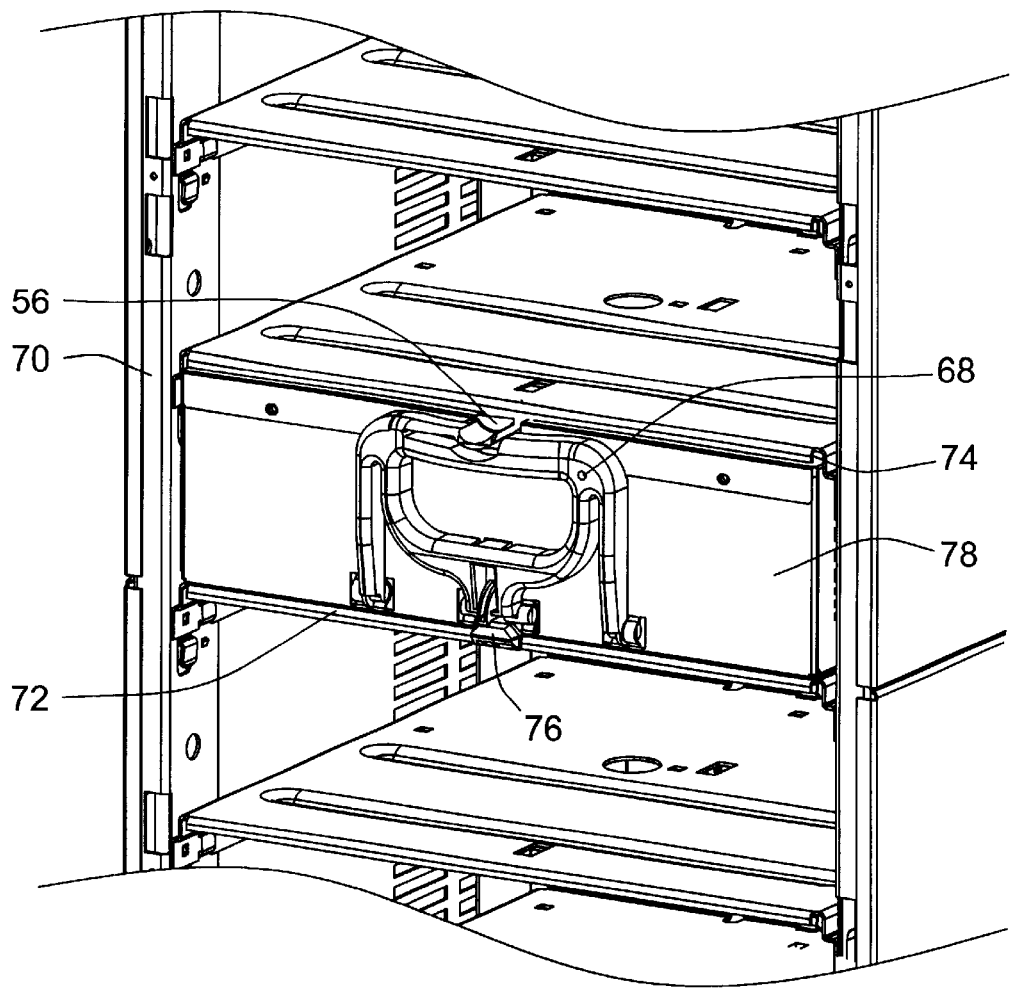
FIG. 11 is a front perspective illustration of a modular electronic component inserted into a rack mount position including an embodiment of the multi-function handle of the invention.

While the above description has provided a detailed description of an embodiment of the handle 20 of the invention, a greater understanding of its various aspects, features, and advantages may be had from an analysis of the illustration of FIG. 11, to which specific reference is now made. Illustrated in this FIG. 11 is a modular electronic component 78 mounted in a mounting rack 70 in a particular slot defined by a mounting shelf 72. Such a configuration is typical for an uninterruptible power supply to which this invention is particularly well suited. However, it should be understood that the applicability to other components, products, and industries is not to be excluded by reference to a preferred implementation. As may be seen from this FIG. 11, multiple modular components may be placed in the rack 70. With the modular component inserted fully in the rack 70 the ramped insertion surface serves to lock the component in place by cooperating with lip 74 to prohibit the inadvertent removal of the component 78. Also illustrated in this FIG. 11 is the guide locking head 76 which is engaged by the insertion and extraction claws discussed above to aid in the insertion and extraction of the modular electronic component 78.

Figure 12:
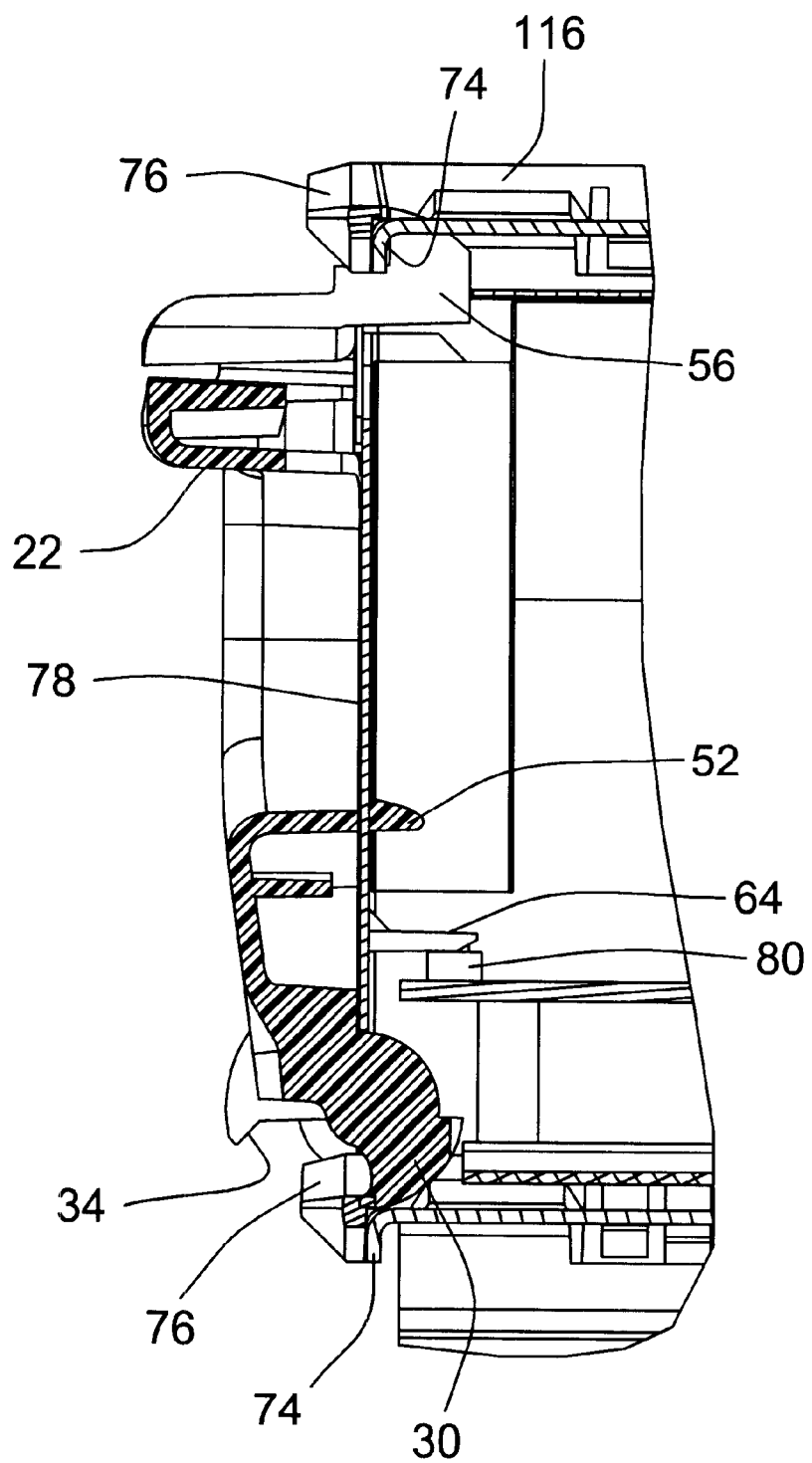
FIG. 12 is a partial cross-sectional illustration of a modular electronic component secured in its mounting rack and including an embodiment of the multi-function handle of the invention.

These relationships may be more fully understood through an analysis of the cross-sectional illustration of FIG. 12. Specifically, once the modular component has been locked into place the insertion surface 56 engages the rack locking lip 74. This rack locking lip 74 accommodates the guide locking head 76 and its associated guide track 116 of the mounting shelf directly above the shelf into which the modular component 78 has been placed. With the handle in this position, the stowage locking mechanism or tab 52 may also be seen to be penetrating the front surface panel 78 of the electronic component to latch the handle in place. Also, the switch activation tab 64 may also be seen to be actuating an engagement switch 80 within the modular electronic component, thereby providing a signal to the internal controls that the unit is in place.

The engagement of the insertion claws 30 with the rear surface of the guide locking head 76 is also illustrated in this FIG. 12. As may be seen, in the stowed position these insertion claws 30 also prevent the modular component from being removed from its slot by their relative position behind the guide locking head 76. As may also be appreciated from this FIG. 12, as the handle 20 is rotated to its extended position, the extraction claw 34 will contact the guide locking head 76 and will provide a mechanical advantage for its extraction thereby.

Figure 13:
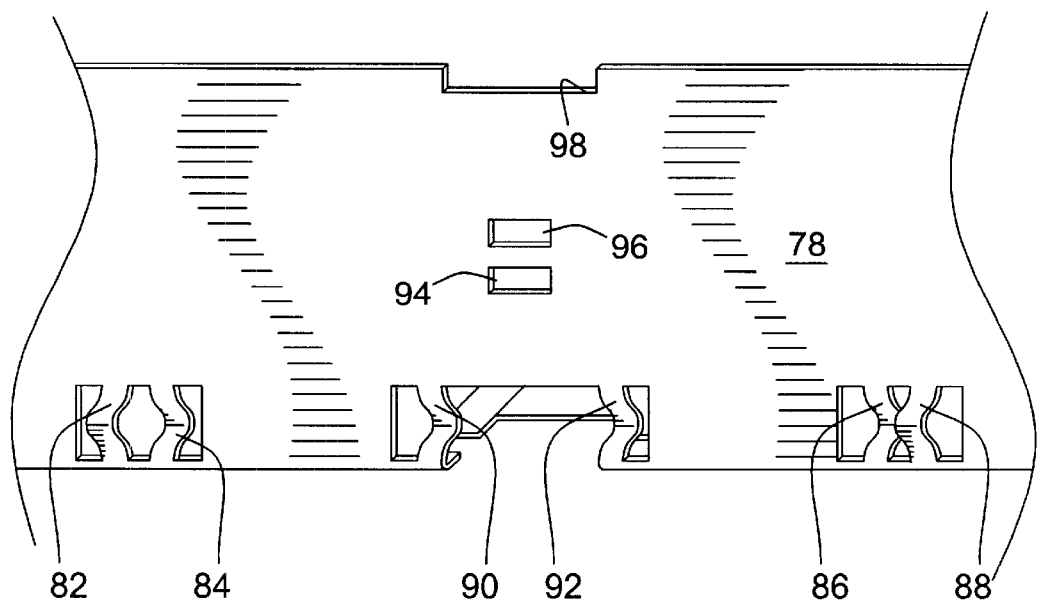
FIG. 13 is a front view illustration of a front panel of a modular electronic component adapted to accommodate an embodiment of the multi-function handle of the invention.
Figure 14:
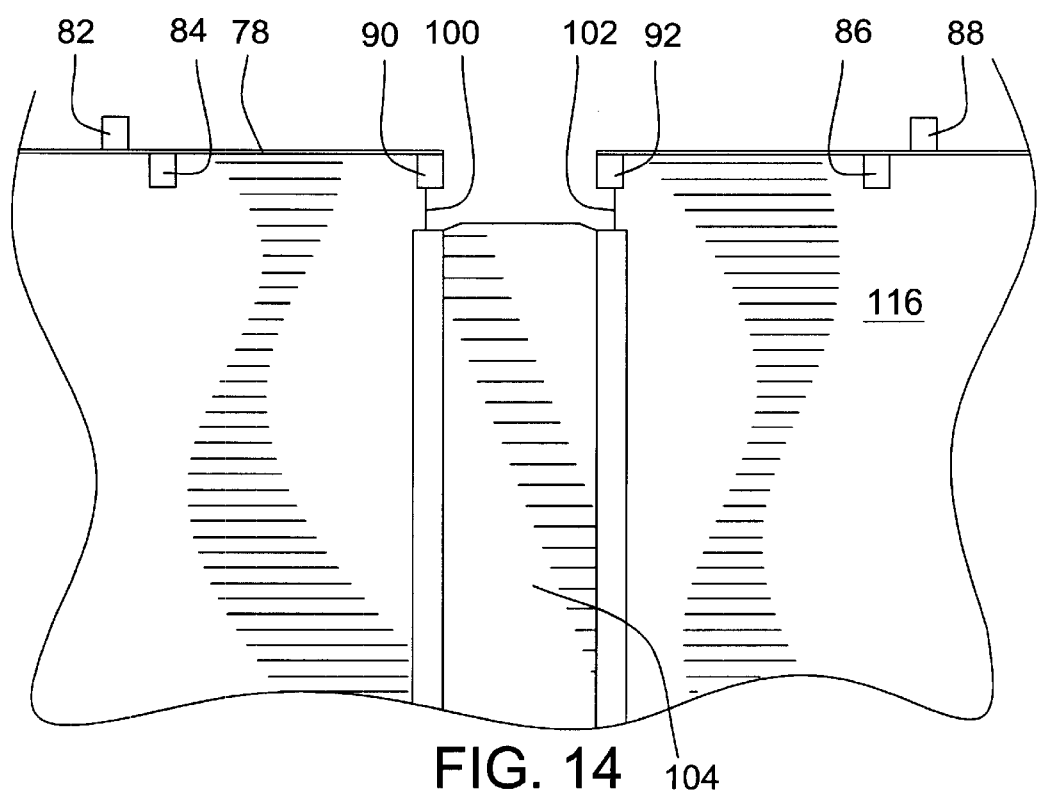
FIG. 14 is a top view illustration of a modular electronic component adapted to utilize an embodiment of the multi-function handle of the invention.

Insertion, retention, and coordination with the modular component is facilitated by the front panel 78 design of the modular component as illustrated in FIG. 13. As illustrated therein, the supplemental support pivots 44, 46 are held in place in relation to the front 78 of the modular component by a convex pivot and support surface 82, 88 and a concave pivot guide surface 84, 86. FIG. 14 provides a top view illustration of the modular component, and may be examined to gain a fuller understanding of the concave and convex structures. This relationship of the concave and convex surfaces also allow for installation of the handle on the front surface 78 of the modular component without the use of any tools, and without requiring any external or additional hardware to maintain the handle in position. The front surface 78 also defines two central concave pivot and support surfaces 90, 92 which cooperate with the pivot axle 26 and the secondary follower axle 28 to define a axis of rotation for the handle 20. This front surface 78 also defines a activation tab window 94 to allow the activation tab 64 to penetrate therethrough. Likewise, a handle stowage locking window 96 is also provided on the front surface 78 of the modular component so that the stowage locking mechanism or tab 52 may maintain the handle in its stowed position. Finally, a rack lock accommodation groove 98 is also provided to allow for proper operation of the rack locking mechanism 54.

As discussed above, the installation of the handle 20 onto the front panel 78 of the modular component requires no tools, and its retention thereon requires no external or additional hardware. The installation of the handle is accommodated by two follower axle insertion windows 100, 102 on the undersurface 116 of the modular component. To accomplish this, the handle is positioned with its central mounting yoke 24 in an upward position with the back of the handle facing forward. The secondary follower axles 28 are then inserted through the follower axle insertion windows 100, 102. Once inserted, the handle is rotated forward and upward until it attains its normal stowed position.

In this position the outrigging mounting and support legs 40, 42 are inwardly deflected by the user such that its supplemental support pivots 44, 46 may slide back against the concave pivot guide surfaces 84, 86. Once in this position, the legs are allowed to return to their quiescent position, which results in the supplemental support pivots 44, 46 sliding behind the convex pivot and support surfaces 82, 88. The handle is now securely attached to the front surface 78 of the modular component. Now as the handle is downwardly rotated, the removal inhibitor flanges 48 and 50 prevent the inward deflection of the outrigging mounting and support legs thereby prohibiting their removal. Since these legs 40, 42 cannot be removed from their positions, the handle cannot be rotated to a position 180° displaced from its stowed position, thereby preventing the secondary follower axles from being moved back to the follower axle insertion windows 100, 102. In this way, the handle may not be removed from the modular component in a deployed position.

To remove the handle 20 from the front surface 78 of the modular component, the handle 20 is first placed in its stowed position. In this position the outrigging mounting and support legs 40, 42 are inwardly deflected by a user such that their supplemental support pivots are no longer constrained from outward movement by the convex pivot and support surfaces 82, 88. The outrigging mounting and support legs are then moved away from the front surface 78 so that the supplemental support pivots clear the area of the convex pivot and support surfaces 82, 88. Once this has been accomplished, the outrigging mounting and support legs 40, 42 may be released to allow them to return to their normal quiescent position. The handle 20 may then be rotated downward. Since the supplemental support pivots are no longer constrained, the pivot axles 26 move away from the concave central pivot and support surfaces 90, 92. Once the handle 20 has been rotated to its fully down position (180° displaced from its stowed position), it is moved back and under the modular component until the secondary follower axles 28 reach the follower axle insertion windows. At this point the handle is moved vertically downward to remove the secondary follower axles 28 from the modular component by the track guide groove 104, thus completing the removal of the handle 20 from the modular component.

The foregoing description of various preferred embodiments of the invention has been presented for purposes of illustration and description. It is not intended to be exhaustive or to limit the invention to the precise forms disclosed. Obvious modifications or variations are possible in light of the above teachings. The embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A handle, comprising:
    a central mounting yoke defining a pivot axle and a secondary follower axle thereon, said yoke further defining a pair of insertion claws and an extraction claw adapted to communicate with an external guide locking head;
    a carrying surface integrally formed with said yoke; and
    a pair of outrigging mounting and support legs integrally formed with said carrying surface in spaced relationship with said yoke, said outrigging mounting and support legs defining supplemental support pivots in axial alignment with said pivot axle.

2. The handle of claim 1, wherein said outrigging mounting and support legs further define removal inhibitor flanges radially extending beyond said supplemental support pivots along a portion of a circumference thereof, said removal inhibitor flanges being adapted to prevent inadvertent removal of said outrigging mounting and support legs when mounted on an external component.

3. The handle of claim 1, wherein said yoke further defines a stowage locking tab extending inwardly perpendicular to an axis of said yoke and adapted to releasably engage a stowage handle locking window on an external component to hold said handle in place thereon.

4. The handle of claim 1, wherein said yoke further defines a switch activation tab extending inwardly perpendicular to an axis of said yoke, said switch activation tab adapted to engage an external engagement switch when positioned in a stowed position on an external component.

5. The handle of claim 4, wherein said switch activation tab includes an activation bumper positioned thereon.

6. The handle of claim 1, wherein said yoke further defines a rack locking mechanism adapted to removably secure a component on which said handle is mounted to a rack mount chassis in which the component is placed.

7. The handle of claim 6, wherein said rack locking mechanism comprises a locking deflection arm flexibly coupled to said yoke at a first end and forming at a second end thereof a ramped insertion surface and an user depression surface, and wherein said yoke accommodates a deflection of said locking deflection arm from a quiescent locking position to a deflected releasing position.

8. The handle of claim 1, wherein said yoke further defines an extended position support surface extending radially beyond said pivot axial, said extended position support surface adapted to prevent said handle from rotating beyond its extended position when installed on an external component and to provide support for carrying the external component.

9. A modular component, comprising:
a housing having a front surface, said front surface defining a first central window having therein two central concave pivot and support surfaces; and
a handle having a central mounting yoke defining a pivot axle and a secondary follower axle thereon, said handle further defining a carrying surface integrally formed with said yoke; and
wherein said pivot axle is pivotally accommodated within said first central window by said two central concave pivot and support surfaces allowing said handle to be rotated between a parallel and a perpendicular position in relation to said front surface, and wherein said secondary follower axles track along a back side of said central concave pivot and support surfaces when said handle is rotated between said parallel and said perpendicular position.

10. The component of claim 9, wherein said front surface further defines a second and a third window in spaced linear relation to said first window, said second and said third windows having therein a convex pivot and support surface and a concave pivot guide surface, and wherein said handle further including a pair of outrigging mounting and support legs integrally formed in spaced relationship with said yoke, said outrigging mounting and support legs defining supplemental support pivots in axial alignment with said pivot axle, said supplemental support pivots are pivotally accommodated within said second and third windows by said convex pivot and support surface and said concave pivot guide surface.

11. The component of claim 10, wherein said outrigging mounting and support legs further define removal inhibitor flanges radially extending beyond said supplemental support pivots along a portion of a circumference thereof, said removal inhibitor flanges being adapted to prevent inadvertent removal of said outrigging mounting and support legs when mounted in said second and said third windows when said handle in said perpendicular position.

12. The component of claim 9, wherein said front panel further defines a stowage handle locking window, and wherein said yoke further defines a stowage locking tab extending inwardly perpendicular to an axis of said yoke and adapted to releasably engage said stowage handle locking window when said handle is in said parallel position.

13. The component of claim 9, wherein said front panel further defines an activation tab window, and wherein said yoke further defines a switch activation tab extending inwardly perpendicular to an axis of said yoke, said switch activation tab adapted to penetrate said activation tab window when said handle is in said parallel position.

14. The component of claim 13, wherein said switch activation tab includes an activation bumper positioned thereon.

15. The component of claim 9, wherein said front surface further defines a rack lock accommodation groove, and wherein said yoke further defines a rack locking mechanism adapted to removably secure said component to a rack mount chassis in which said component is placed when in said parallel position.

16. The component of claim 15, wherein said rack locking mechanism comprises a locking deflection arm flexibly coupled to said yoke at a first end and forming at a second end thereof a ramped insertion surface and an user depression surface, and wherein said yoke accommodates a deflection of said locking deflection arm from a quiescent locking position to a deflected releasing position, said deflection further being accommodated by said rack lock accommodation groove.

17. The component of claim 9, wherein said yoke further defines an extended position support surface extending radially beyond said pivot axial, said extended position support surface adapted to prevent said handle from rotating beyond its extended position and to provide support for carrying said component by engaging a back side of said front surface.

18. The component of claim 9, wherein said housing further includes a bottom surface defining a follower axial insertion window in proximity to said first central window, and wherein said yoke further defines a pair of insertion claws adapted to communicate with an external guide locking head of a rack into which said component is placed, said insertion claws rotating through said follower axial insertion window when said handle is rotated between said parallel and said perpendicular positions.

19. The component of claim 9, wherein said yoke further defines an extraction claw adapted to communicate with an external guide locking head of a rack into which said component is placed to provide mechanical advantage to remove said component when said handle is rotated from a parallel to a perpendicular position.

* * * * *